United States Patent
Chan et al.

(10) Patent No.: US 9,099,509 B2
(45) Date of Patent: Aug. 4, 2015

(54) DUAL TRAY CARRIER UNIT

(75) Inventors: Foon M. Chan, Hong Kong (CN); King W. Cheung, Hong Kong (CN); Ka C. Leung, Hong Kong (CN); Chi Y. C. Chan, Hong Kong (CN); Carolus Truyens, Rotselaar (BE); Erik J. J. M. DeBlock, Heverlee (BE); Jimmy J. D. Vermeulen, Sint-Agatha-Berchem (BE)

(73) Assignee: KLA-Tencor Corporation, Milpitas, CA (US)

( * ) Notice: Subject to any disclaimer, the term of this patent is extended or adjusted under 35 U.S.C. 154(b) by 816 days.

(21) Appl. No.: 13/259,343

(22) PCT Filed: Sep. 23, 2011

(86) PCT No.: PCT/US2011/020166
§ 371 (c)(1),
(2), (4) Date: Sep. 23, 2011

(87) PCT Pub. No.: WO2011/084972
PCT Pub. Date: Jul. 14, 2011

(65) Prior Publication Data
US 2012/0090495 A1    Apr. 19, 2012

Related U.S. Application Data

(60) Provisional application No. 61/293,339, filed on Jan. 8, 2010.

(51) Int. Cl.
*H01L 21/673* (2006.01)
*H01L 21/677* (2006.01)
*B65G 37/00* (2006.01)

(52) U.S. Cl.
CPC .... *H01L 21/67333* (2013.01); *H01L 21/67736* (2013.01); *B65G 37/005* (2013.01)

(58) Field of Classification Search
CPC ......... B61B 13/04; E01B 25/10; E01B 25/08; E01B 25/00; B61J 1/10; B65G 35/06; B65G 37/005; B65G 47/918; B65G 47/901; B65G 47/90; B62D 65/18; B25J 9/023; B25J 9/144; B25J 18/04; B25J 15/0052; B25J 15/0616; B25J 15/0206; B21D 43/003; B21D 28/243; B21D 43/055; H01L 21/67742; H01L 21/68707; H01L 21/67778; H01L 21/67333; H01L 21/67736; B23Q 7/003; B23Q 7/005; B23Q 7/04
USPC .......... 104/118, 48; 198/620; 414/332, 749.1, 414/749.5, 749.6, 751.1, 753.1
See application file for complete search history.

(56) References Cited

U.S. PATENT DOCUMENTS 3,286,324 A * 11/1966 Hautau ......................... 29/27 B
(Continued)

FOREIGN PATENT DOCUMENTS

JP           03044576 U      4/1991
(Continued)

*Primary Examiner* — Saul Rodriguez
*Assistant Examiner* — Glenn Myers
(74) *Attorney, Agent, or Firm* — Luedeka Neely Group, P.C.; Rick Barnes

(57) ABSTRACT

A tray carrier system having a tray loading position, a tray off-loading position, and four parallel rails extending from the tray loading position to the tray off-loading position. A tray carrier platform is disposed on each rail, where each tray carrier platform is configured to move along the rail on which it is disposed between the tray loading position and the tray off-loading position. Each tray carrier platform includes a carriage for engaging the rail, swing arms attached to the carriage, retaining pieces attached to the swing arms for selectively retaining and releasing a tray, and means for moving the swing arms between an open position and a closed position. The retaining pieces retain the tray at a tray level when the swing arms are in the closed position, and release the tray and are disposed entirely below the tray level when the swing arms are in the open position. Two of the tray carrier platforms form a first tray carrier unit, and the other two tray carrier platforms form a second tray carrier unit. The first tray carrier unit is capable of passing underneath a tray carried by the second tray carrier unit in the closed position when the first tray carrier unit is in the open position.

20 Claims, 3 Drawing Sheets

(56) References Cited

U.S. PATENT DOCUMENTS

| | | | |
|---|---|---|---|
| 5,588,797 A * | 12/1996 | Smith | 414/797.5 |
| 6,169,935 B1 * | 1/2001 | Iwasaki et al. | 700/214 |
| 6,183,186 B1 * | 2/2001 | Howells et al. | 414/416.03 |
| 6,471,460 B1 * | 10/2002 | Pedersen et al. | 414/222.09 |
| 8,079,139 B1 * | 12/2011 | Lin et al. | 29/825 |
| 8,529,185 B2 * | 9/2013 | Hirasawa et al. | 414/749.6 |
| 2007/0147976 A1 * | 6/2007 | Rice et al. | 414/217 |
| 2010/0221093 A1 * | 9/2010 | Mogenet et al. | 414/589 |

FOREIGN PATENT DOCUMENTS

| | | |
|---|---|---|
| JP | 06246656 A | 9/1994 |
| JP | 07050334 A | 2/1995 |
| JP | 2000232080 A | 8/2000 |
| WO | 2006115745 | 11/2006 |
| WO | 2010005246 A2 | 1/2010 |

\* cited by examiner

DUAL TRAY CARRIER UNIT

FIELD

This application claims all rights and priority on prior pending U.S. provisional patent application Ser. No. 61/293,339 filed 2010.01.08 and international patent application serial number PCT/US2011/020166 filed 2011.01.05.This invention relates to the field of integrated circuit fabrication. More particularly, this invention relates to tray carrier units, such as are used in integrated circuit taping operations.

INTRODUCTION

Integrated circuits are typically monolithically fabricated, meaning that more than one integrated circuit (from several to thousands) is fabricated on a single substrate. When that phase of the fabrication cycle has been completed, the integrated circuits are singulated and placed into a tray. The tray is typically a plastic carrier that has individual pockets for the individual integrated circuits. Trays can be stacked and are used for the relatively short-term protection, transport, and storage of the integrated circuits.

A step in the integrated fabrication cycle is to move the singulated integrated circuits from the trays and place them in pockets of a long tape called carrier tape. Because of the way that the pockets are connected, this process is typically referred to as taping the integrated circuits.

The device that removes each integrated circuit one (or multiple) at a time from the tray and places it into the proper position onto the carrier on the tape is called a pick and place—it picks the integrated circuit from the tray and places it on the tape.

There is a desire for the taping process to proceed as quickly as possible. Speeding up the pick and place is one way to reduce the time needed to tape a tray of integrated circuits. However, regardless of the speed of the pick and place, there is a certain amount of overhead that is required for the tray carrier unit to offload an empty tray, load a full tray, and move it into position for the pick and place. Any amount of time that the pick and place is just waiting for the tray carrier unit to bring it another tray of integrated circuits is substantially wasted time, and typically ranges from about ten to fifty percent of the entire operation time.

What is needed, therefore, is a system that overcomes problems such as those described above, at least in part.

SUMMARY OF THE CLAIMS

The above and other needs are met by a tray carrier system having a tray loading position, a tray off-loading position, and four parallel rails extending from the tray loading position to the tray off-loading position. A tray carrier platform is disposed on each rail, where each tray carrier platform is configured to move along the rail on which it is disposed between the tray loading position and the tray off-loading position. Each tray carrier platform includes a carriage interfacing with the rail system, swing arms attached to the carriage, retaining pieces attached to the swing arms for selectively retaining and releasing a tray, called tray clamps, and means for moving the swing arms between an open position and a closed position. The retaining pieces retain the tray at a tray level when the swing arms are in the closed position, and release the tray and are disposed entirely below the tray level when the swing arms are in the open position. Two of the tray carrier platforms form a first tray carrier unit, and the other two tray carrier platforms form a second tray carrier unit. The first tray carrier unit is capable of passing underneath a tray carried by the second tray carrier unit in the closed position when the first tray carrier unit is in the open position and vise versa.

In this manner, one of the tray carrier units holds a first tray of integrated circuits that are being taped by the pick and place, while the other tray carrier unit can dispose of its empty tray, pass underneath the tray held by the other tray carrier unit, pick up a full tray of integrated circuits, and be in position to be accessed by the pick and place as soon as it has finished emptying the first tray. Thus, the overhead associated with a prior art pick and place system is reduced, and in some embodiments eliminated.

In various embodiments according to this aspect of the invention, the two rails of the first tray carrier unit are interdigitated with the two rails of the second tray carrier unit. In some embodiments one of the tray carrier platforms in each tray carrier unit is larger than the other tray carrier platform in the same tray carrier unit. In some embodiments the first tray carrier unit is configured to dispose of an empty tray at the tray off-loading position, pass the second tray carrier unit that is holding a tray, and receive a full tray at the tray loading position, before the tray held by the second tray carrier unit is emptied of integrated circuits. In some embodiments the means for moving the swing arms is a pneumatic cylinder. In other embodiments the means for moving the swing arms is a motor. In some embodiments springs are disposed between the swing arms and the carriage to retain the retaining pieces in the closed position when the means for moving the swing arms fails. In some embodiments the retaining pieces have a horizontal portion for supporting a bottom of the tray, and a vertical portion for aligning the tray to a known position by means of side pusher. In some embodiments the vertical portion extends above a top surface of the tray. In other embodiments the vertical portion does not extend above a top surface of the tray. In some embodiments the retaining pieces have a notch for engaging a bottom surface, side, and top surface of the tray.

According to another aspect of the invention, there is described an integrated circuit taping system having a tray carrier system with a tray loading position, a tray off-loading position, four parallel rails extending from the tray loading position to the tray off-loading position, a tray carrier platform disposed on each rail, each tray carrier platform configured to move along the rail on which it is disposed between the tray loading position and the tray off-loading position, each tray carrier platform having a carriage for engaging the rail, swing arms attached to the carriage, retaining pieces attached to the swing arms for selectively retaining and releasing a tray, and means for moving the swing arms between an open position and a closed position, where the retaining pieces retain the tray at a tray level when the swing arms are in the closed position, and the retaining pieces release the tray and are disposed entirely below the tray level when the swing arms are in the open position, and two of the tray carrier platforms forming a first tray carrier unit and other two of the tray carrier platforms forming a second tray carrier unit, where the first tray carrier unit is capable of passing underneath a tray carried by the second tray carrier unit in the closed position when the first tray carrier unit is in the open position, a tray loading station for delivering full trays of integrated circuits to the tray carrier units in the tray loading position, a tray off-loading station for removing empty trays from the tray carrier units in the tray off-loading position, and a pick-and-place unit disposed in an intermediate position between the tray loading position and the tray off-loading position, for removing integrated circuits from the tray of a tray carrier unit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

According to various embodiments of the present invention, there is provided a tray carrier system having at least two independent carrier units that can be independently opened and closed to selectively release and retain a tray, such as by using pneumatic cylinders to actuate tray engaging and holding mechanisms on the ends of each unit. When one of the carrier units is in an open position (where it is not holding a tray), it can pass underneath a tray that is being held by the other carrier unit. In this manner, the two carrier units can operate independently of and pass one another. Thus, while one of the carrier units is holding a tray of integrated circuits being taped by the pick and place, the other carrier unit can dispose of an empty tray and go get a loaded tray, to await staging.

Figure 1:
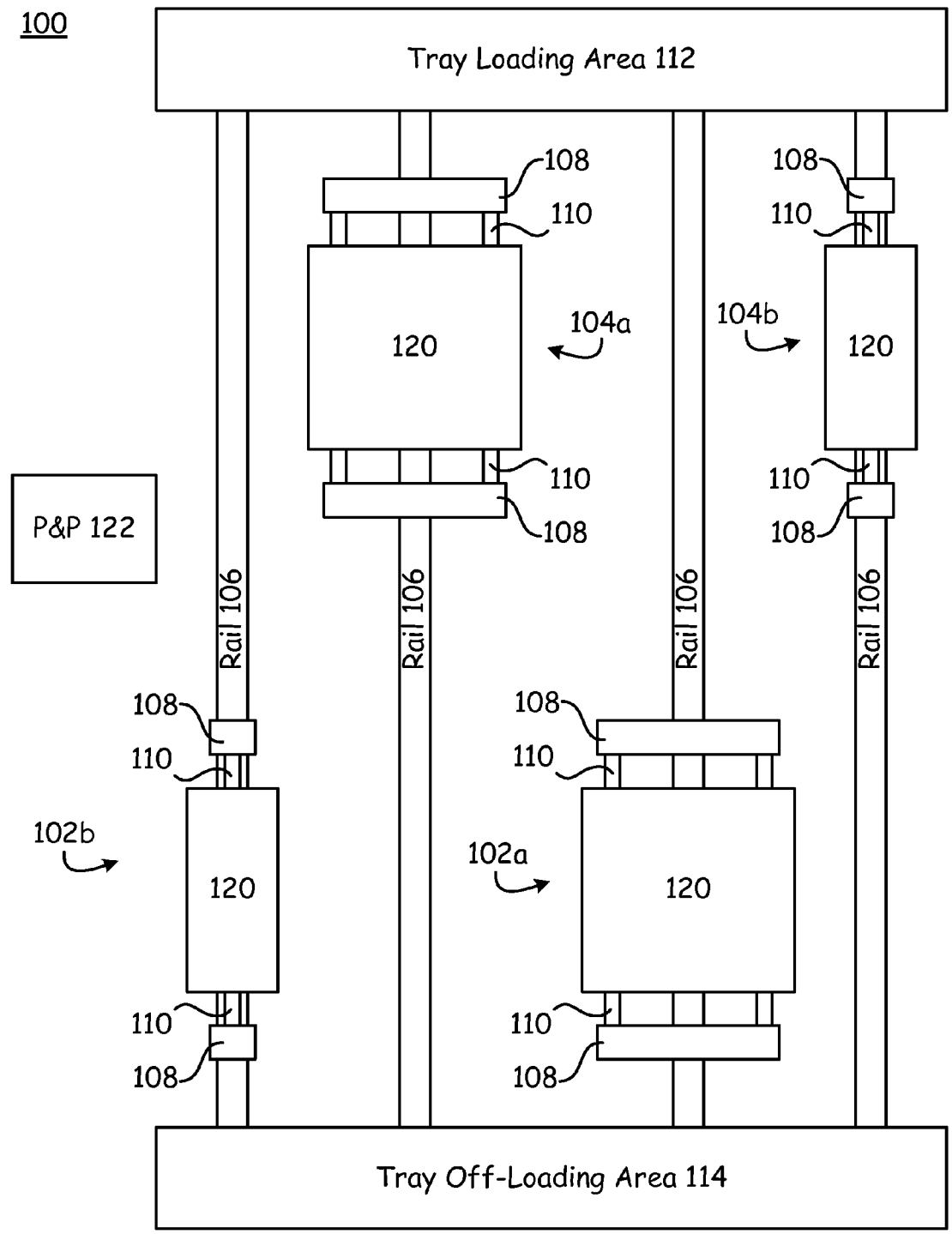
FIG. 1 is a top plan view of an apparatus having two tray carrier units according to an embodiment of the present invention, where both tray carrier units are in an open position and neither tray carrier unit is holding a tray.

One embodiment of a system 100 according to the present invention is depicted in FIG. 1. It is appreciated that other embodiments are contemplated herein. The embodiment of FIG. 1 has two carrier units 102 and 104 that operate independently of one another, in that they move along the rails 106 from the tray loading area 112, to an intermediate position where they can be accessed by the pick and place unit 122, to the tray off-loading area 114, passing each other as needed, each without disturbing the operation of the other.

In the depicted embodiment, each tray carrier unit 102/104 has two platforms, one of which is called the main platform 102a/104a and the second of which is called the support platform 102b/104b. In some embodiments the main platform 102a/104a is larger than the support platform 102b/104b. All of the platforms 102/104 have a carriage 120, as further described below, which facilitates movement along the rails 106 and other operations.

Retaining pieces 108 at each end of each of the four carriages 120 can pivot up into a more vertical position on swing arms 110, in which position the carrier unit 102/104 is considered to be closed, and in which position the retaining pieces 108 can hold a tray 116. The retaining pieces 108 can also pivot down into a more horizontal position on the swing arms 110, in which position the carrier unit 102/104 is considered to be open, and does not hold a tray 116. The retaining pieces 108 as depicted in FIG. 1 are in the more horizontal, or open position, and no trays 116 are depicted in the drawing.

Figure 2:
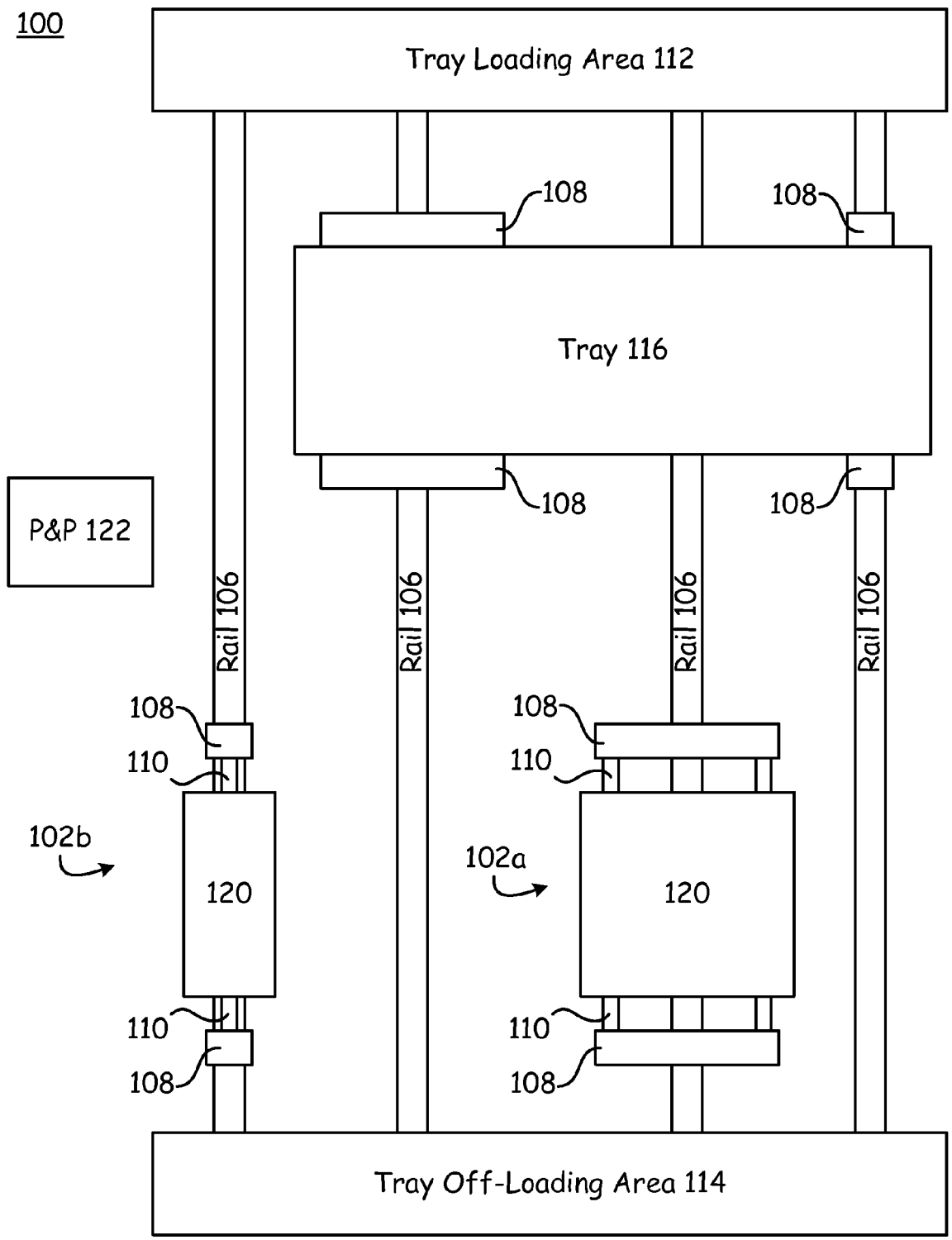
FIG. 2 is a top plan view of an apparatus having two tray carrier units according to an embodiment of the present invention, where one tray carrier unit is in an open position and the other tray carrier unit is in a closed position and holding a tray.

As depicted in FIG. 2, the retaining pieces 108 for the carrier unit 104 have been moved into the more vertical, closed position by the swing arms 110, and are retaining a tray 116.

Figure 3:
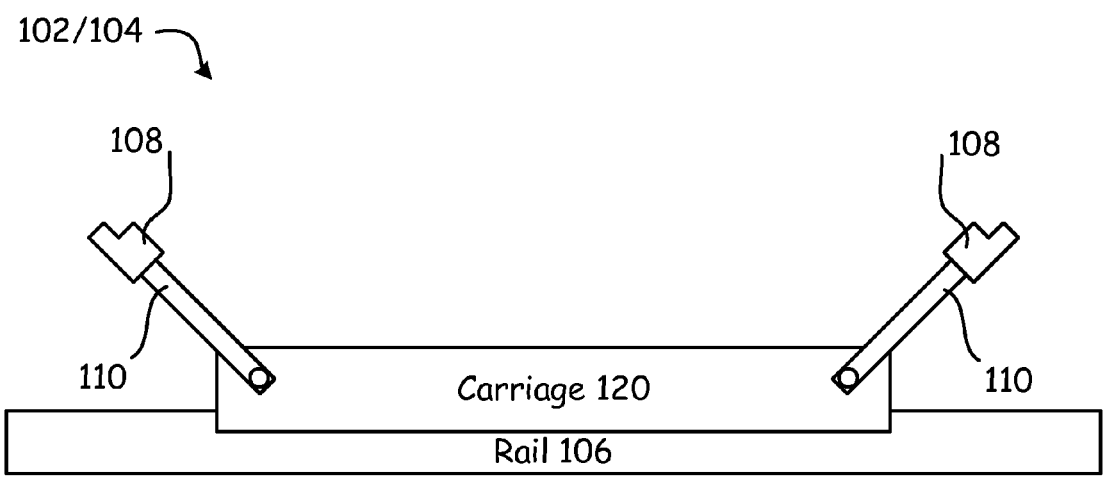
FIG. 3 is a side elevation view of a tray carrier platform in an open position without a tray, according to an embodiment of the present invention.

FIG. 3 depicts one of the platforms, such as platform 102a, in a side elevation view, where the pivoting swing arms 110 have the retaining pieces 108 in the open position. When the swing arms 110 are in this position, the retaining pieces 108 are disposed below the level of the bottom of a tray 116 that is clamped to the other carrier unit 104, and so the platform 102a/b can move back and forth along the rails 106 underneath the tray 116 that is held by the other carrier unit 104.

Figure 4:
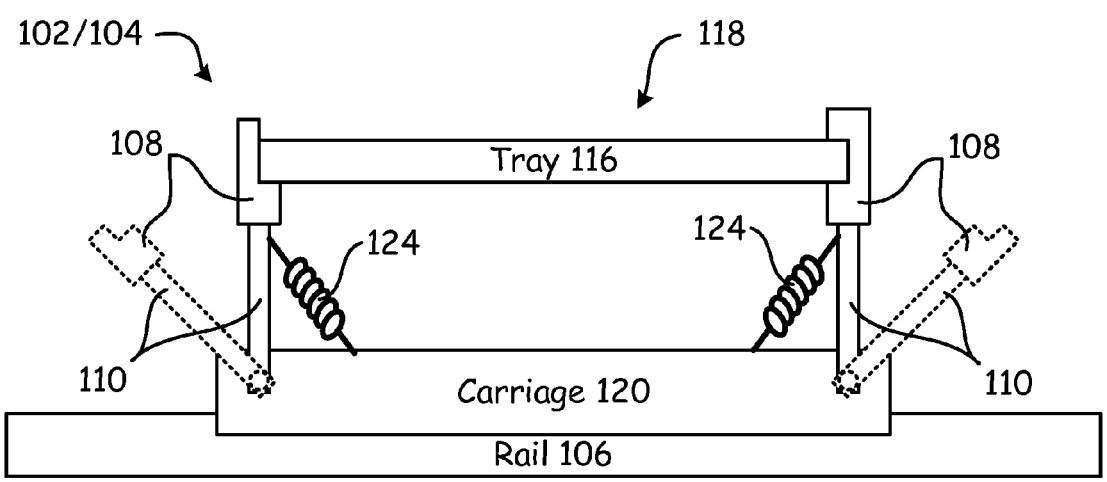
FIG. 4 is a side elevation view of a tray carrier platform in a closed position and holding a tray, according to an embodiment of the present invention.

FIG. 4 depicts the platform 102a in a side elevation view, where the pivoting swing arms 110 have the retaining pieces 108 in the more vertical closed position. In one embodiment, springs 124 are added to prevent the retaining pieces 108 from opening in the case of an air pressure loss. Also depicted in phantom in FIG. 4 are the positions for the swing arms 110 and retaining pieces 108 in the more horizontal open position. Integrated circuits 118 are disposed upon the top of the tray 116. As can be seen in FIG. 4, the tray 116 itself does not slide along any surface, and so friction between the tray 116 and another surface is eliminated. This helps resolve problems such as are caused by tray warpage and undesired vibration.

In some embodiments, the retaining pieces 108 provide a horizontal flat surface that supports the bottom edge of the tray 116, and also provide a vertical flat surface that presses against the sidewall of the tray 116 and aligns the tray 116 to a known position. In some embodiments, the vertical flat surface extends above the top surface of the tray 116, as depicted on the left-hand side of FIG. 4, and in other embodiments the vertical flat surface does not extend above the top surface of the tray, as depicted in phantom in FIG. 4. In some embodiments the retaining pieces provide a notch that fits from the bottom surface of the tray 116, up the side of the tray 116, and onto the top surface of the tray 116, as depicted on the right-hand side of FIG. 4. Thus, various embodiments of the retaining pieces 108 are contemplated herein.

Each platform 102a/b and 104a/b has its own actuating mechanism (such as a pneumatic cylinder) for selectively opening and closing the carrier unit 102/104, but each of the two platforms a/b in a given carrier unit 102/104 are controlled by a single electrical output, to ensure their simultaneous opening and closing. In some embodiments each carrier unit 102 or 104 is driven by separate servomotors with belt and pulley systems that are dedicated to each carrier unit 102 or 104. The main platform a and support platform b within a given carrier unit 102/104 are driven by a single belt and pulley system that powers shafts for the simultaneous movement of the main platform a and support platform b, to avoid mechanical skewing between the two platforms a/b of a given carrier unit 102 or 104.

In the various embodiments, carriage 120 contains elements such as glide or wheels for tracking along the rail 106, threaded pieces for engaging a turning shaft, motors, electronics, sensors, and pneumatics, all as generally described above in the various embodiments for the operation of the system 100.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A tray carrier system, comprising:
    a tray loading position,
    a tray off-loading position,
    four parallel rails extending from the tray loading position to the tray off-loading position,
    a tray carrier platform mounted on each rail, each tray carrier platform configured to move along the rail on which it is disposed between the tray loading position and the tray off-loading position, each tray carrier platform comprising,
        a carriage for engaging the rail,
        swing arms attached to the carriage,
        retaining pieces attached to the swing arms for selectively retaining and releasing a tray, and
        means for moving the swing arms between an open position and a closed position, where the retaining pieces retain the tray at a tray level when the swing arms are in the closed position, and the retaining pieces release the tray and are disposed entirely below the tray level when the swing arms are in the open position, and
    two of the tray carrier platforms for carrying together a first tray and thereby comprising a first tray carrier unit, and other two of the tray carrier platforms for carrying together a second tray and thereby comprising a second tray carrier unit,
    where the first tray carrier unit is capable of passing underneath the tray carried by the second tray carrier unit in the closed position when the first tray carrier unit is in the open position.

2. The tray carrier system of claim 1, wherein the two rails of the first tray carrier unit are interdigitated with the two rails of the second tray carrier unit.

3. The tray carrier system of claim 1, wherein one of the tray carrier platforms in each tray carrier unit is larger than the other tray carrier platform in the same tray carrier unit.

4. The tray carrier system of claim 1, wherein the first tray carrier unit is configured to dispose of an empty tray at the tray off-loading position, pass the second tray carrier unit that is holding a tray, and receive a full tray at the tray loading position, before the tray held by the second tray carrier unit is emptied of integrated circuits.

5. The tray carrier system of claim 1, wherein the means for moving the swing arms comprises a pneumatic cylinder.

6. The tray carrier system of claim 1, wherein the means for moving the swing arms comprises a motor.

7. The tray carrier system of claim 1, further comprising springs disposed between the swing arms and the carriage, and configured to retain the retaining pieces in the closed position when the means for moving the swing arms fails.

8. The tray carrier system of claim 1, wherein the retaining pieces comprise a horizontal portion for supporting a bottom of the tray, and vertical portion for aligning the tray to a known position.

9. The tray carrier system of claim 8, wherein the vertical portion extends above a top surface of the tray.

10. The tray carrier system of claim 8, wherein the vertical portion does not extend above a top surface of the tray.

11. The tray carrier system of claim 1, wherein the retaining pieces comprise a notch for engaging a bottom surface, side, and top surface of the tray.

12. An integrated circuit taping system, comprising:
    a tray carrier system, comprising:
        a tray loading position,
        a tray off-loading position,
        four parallel rails extending from the tray loading position to the tray off-loading position,
        a tray carrier platform disposed on each rail, each tray carrier platform configured to move along the rail on which it is disposed between the tray loading position and the tray off-loading position, each tray carrier platform comprising,
            a carriage for engaging the rail,
            swing arms attached to the carriage,
            retaining pieces attached to the swing arms for selectively retaining and releasing a tray, and
            means for moving the swing arms between an open position and a closed position, where the retaining pieces retain the tray at a tray level when the swing arms are in the closed position, and the retaining pieces release the tray and are disposed entirely below the tray level when the swing arms are in the open position, and
        two of the tray carrier platforms for carrying together a first tray and thereby comprising a first tray carrier unit, and other two of the tray carrier platforms for carrying together a second tray and thereby comprising a second tray carrier unit,
        where the first tray carrier unit is capable of passing underneath the tray carried by the second tray carrier unit in the closed position when the first tray carrier unit is in the open position,
    a tray loading station for delivering a full tray of integrated circuits to the tray carrier units in the tray loading position,
    a tray off-loading station for removing an empty tray from the tray carrier units in the tray off-loading position, and
    a pick-and-place unit disposed in an intermediate position between the tray loading position and the tray off-loading position, for removing integrated circuits from the tray of a tray carrier unit.

13. The integrated circuit taping system of claim 12, wherein the two rails of the first tray carrier unit are interdigitated with the two rails of the second tray carrier unit.

14. The integrated circuit taping system of claim 12, wherein the first tray carrier unit is configured to dispose of an empty tray at the tray off-loading position, pass the second tray carrier unit that is holding a tray at the intermediate position, and receive a full tray at the tray loading position, before the tray held by the second tray carrier unit is emptied of integrated circuits.

15. The integrated circuit taping system of claim 12, wherein the means for moving the swing arms comprises a pneumatic cylinder.

16. The integrated circuit taping system of claim 12, wherein the means for moving the swing arms comprises a motor.

17. The integrated circuit taping system of claim 12, further comprising springs disposed between the swing arms and the carriage, and configured to retain the retaining pieces in the closed position when the means for moving the swing arms fails.

18. The integrated circuit taping system of claim 12, wherein the retaining pieces comprise a horizontal portion for supporting a bottom of the tray, and vertical portion for aligning the tray to a known position.

19. The integrated circuit taping system of claim 18, wherein the vertical portion extends above a top surface of the tray.

20. The integrated circuit taping system of claim 19, wherein the vertical portion does not extend above a top surface of the tray.

* * * * *